United States Patent
Matsufusa et al.

[11] Patent Number: 5,926,171
[45] Date of Patent: *Jul. 20, 1999

[54] COORDINATE DATA INPUT DEVICE

[75] Inventors: Hideto Matsufusa; Ryuichi Hagiya; Naoki Yamada, all of Fukushima-ken, Japan

[73] Assignee: ALPS Electric Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/845,818

[22] Filed: Apr. 29, 1997

[30] Foreign Application Priority Data

May 14, 1996 [JP] Japan ...................................... 8-118960

[51] Int. Cl.$^6$ .............................. G08C 21/00; G09G 5/00
[52] U.S. Cl. ...................... 345/173; 345/174; 178/18.01; 178/18.03; 178/18.06
[58] Field of Search ..................................... 345/173, 174, 345/179; 178/18.01, 18.03, 18.05, 18.06, 19.03

[56] References Cited

U.S. PATENT DOCUMENTS

| | | | |
|---|---|---|---|
| 4,672,153 | 6/1987 | Kikuchi | 178/18 |
| 4,958,148 | 9/1990 | Olson | 345/174 |
| 4,963,417 | 10/1990 | Taniguchi | 178/18 |
| 5,218,351 | 6/1993 | Hashikawa | 345/30 |
| 5,305,017 | 4/1994 | Gerpheide | 345/174 |
| 5,386,219 | 1/1995 | Greanias | 345/179 |

*Primary Examiner*—Vijay Shankar
*Attorney, Agent, or Firm*—Brinks Hofer Gilson & Lione

[57] ABSTRACT

A coordinate data input device comprises: a sensing board fabricated by forming a plurality of parallel first electrodes on the front surface of a film and forming a plurality of parallel second electrodes perpendicularly to the first electrodes on the back surface of the film, and capable of providing a current corresponding to an electrostatic capacitance between the respective groups of the first and the second electrodes; a resist layer of a thickness equal to that of the first electrodes, formed in regions in the front surface of the film in which the first electrodes are not formed; and a protective sheet adhesively bonded to the respective surfaces of the filling layer and the first electrodes.

3 Claims, 1 Drawing Sheet

COORDINATE DATA INPUT DEVICE

BACKGROUND OF THE INVENTION

The present invention relates to a coordinate data input device of an electrostatic capacity type capable of detecting the position of a point on a screen touched mainly with a finger through the detection of a change in electrostatic capacity.

Recently, a coordinate data input device of an electrostatic capacity type generally referred to as tablet has been put to practical use. An operator is able to enter the x- and the y-coordinate of a point on the screen of the coordinate data input device by touching the point with a finger.

Referring to FIG. 3, a conventional coordinate data input device has a printed wiring board, not shown, a sensing board 1 using a rectangular dielectric film 4 as a base film and placed on the printed wiring board, and a protective sheet 3 placed on the sensing board 1. The dielectric film of the sensing board 1 is provided on its front surface with a plurality of parallel x-electrodes 5 of a thickness in the range of 7 to 10 $\mu$m extended in parallel to the x-axis, and on its back surface with a plurality of parallel y-electrodes, not shown, extended in parallel to the y-axis. An adhesive layer 2 of an acrylic resin or the like is formed on the back surface of the protective sheet 3 to bond the protective sheet adhesively to the sensing board 1. The protective sheet 3 must have an appropriate thickness of about 0.1 mm so that the front surface of the protective sheet 3 serving as a touch surface to which touches are given with a position indicator, such as a finger, is kept flat and the protective sheet 3 is able to protect the x-electrodes of the sensing board 1 from operating force applied to the front surface thereof. A circuitry, not shown, for driving and controlling the electrodes of the sensing board 1 is formed on the back surface of the printed wiring board.

When an operator's finger is put to an optional position on the protective sheet 3 overlying the sensing board 1, part of lines of electric force extending from the x-electrodes toward the y-electrodes is intercepted by the operator's finger to reduce lines of electric force reaching the y-electrodes, so that the electrostatic capacity changes, and the coordinates of the position touched with the operator's finger can be determined on the basis of an output current produced by the sensing sheet varying according to the variation of the electrostatic capacity.

In this conventional coordinate data input device of an electrostatic capacity type, the protective sheet 3 provided with the adhesive layer 2 of an acrylic resin or the like on the back surface thereof is bonded adhesively to the sensing board 1. It is difficult to bond the protective sheet 3, which is a film of a thickness of about 0.2 mm, to the sensing board 1 so as to conform exactly to the irregular surface of the sensing board 1, and bubbles B are liable to be formed beside the x-electrodes 5 as shown in FIG. 3 because the protective sheet 3 is unable to conform exactly to the height of the x-electrodes 5. Air contained in the bubbles B sealed in the adhesive layer 2 affects capacitance. Therefore, when a finger is moved linearly on the protective sheet 3 of the conventional coordinate data input device in which many bubbles of indefinite shapes are liable to be formed on the surface of the sensing board 1, the linearity of coordinates varies from position to position, and the coordinate data input device cannot detect positions in a high accuracy.

Although the possibility of forming bubbles can be reduced by reducing the thickness of the protective sheet 3 because a thinner protective sheet can more easily conform to the irregularities. However, since the surface of the protective sheet of a reduced thickness, i.e., the touch surface, is liable to become irregular according to the underlying irregularities if the protective sheet 3 has a reduced thickness, capacity is liable to vary according to a position to which a touch is given with a finger and the operational facility of the coordinate data input device is deteriorated.

SUMMARY OF THE INVENTION

Accordingly, it is an object of the present invention to provide a coordinate data input device having a sensing board provided on its front surface with electrodes, and a protective sheet adhesively bonded to the front surface of the sensing board without confining any bubbles on the surface of the sensing board so that the flatness of the surface thereof may not be deteriorated.

According to one aspect of the present invention, a coordinate data input device comprises: a sensing board fabricated by forming a plurality of parallel first electrodes on the front surface of a film and forming a plurality of parallel second electrodes perpendicularly to the first electrodes on the back surface of the film, and capable of providing a current corresponding to an electrostatic capacitance between the respective groups of the first and the second electrodes; a filling layer of a thickness equal to that of the first electrodes, formed in regions in the front surface of the film in which the first electrodes are not formed; and a protective sheet to be touched with a position indicator, such as a finger, adhesively bonded to the respective surfaces of the filling layer and the first electrodes. The filling layer may be a resist layer formed on the front surface of the sensing board by printing.

In this coordinate data input device, spaces between the adjacent first electrodes are filled up with the filling layer, so that the surface of the sensing board provided with the filling layer is a substantially flat surface scarcely having irregularities. The protective sheet adhesively bonded to the substantially flat surface of the sensing board provides a flat touch surface, will not confine bubbles on the sensing board, prevents the variation of capacitance from position to position.

According to another aspect of the present invention, a coordinate data input device comprises: a sensing board fabricated by forming a plurality of parallel first electrodes on the front surface of a film and forming a plurality of parallel second electrodes perpendicularly to the first electrodes on the back surface of the film, and capable of providing a current corresponding to an electrostatic capacitance between the respective groups of the first and the second electrodes; a protective sheet to be touched with a position indicator, such as a finger, adhesively bonded to the front surface of the sensing board; and an adhesive layer formed by setting a layer of an adhesive gel sandwiched between the front surface of the sensing board and the back surface of the protective sheet. It is preferable to spread the adhesive gel over the back surface of the protective sheet before bonding the protective sheet to the sensing board.

In this coordinate data input device, a layer of the adhesive gel is sandwiched between the sensing board and the protective sheet in a fabricating process, the adhesive gel does not deteriorate the flatness of the protective sheet and fills up recesses on the front surface of the sensing board. Therefore, the protective sheet can be bonded adhesively to the sensing board without confining bubbles on the sensing board by solidifying the adhesive gel, the variation of capacitance can be prevented, and the surface of the protective film forms a flat touch surface.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
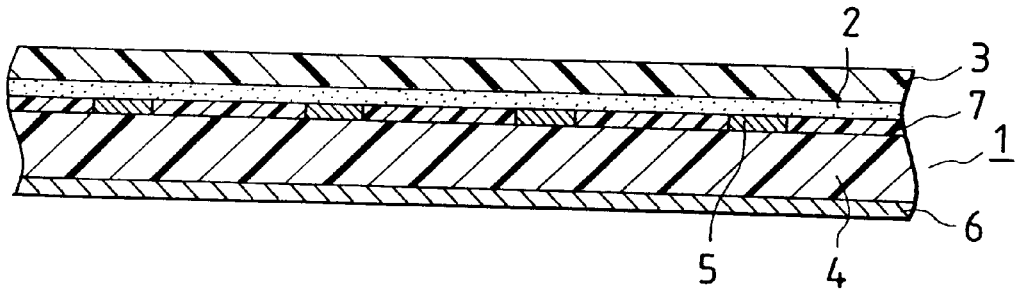
FIG. 1 is a fragmentary sectional view of a coordinate data input device in a first embodiment according to the present invention.

Referring to FIG. 1, a coordinate data input device in a first embodiment according to the present invention is fabricated by mounting a sensing board 1 using a rectangular dielectric film 4 as a base film on a printed wiring board, not shown, forming a resist layer of a pattern corresponding to the pattern of recesses on the sensing board 1 on the front surface of the sensing board 1 by printing, and adhesively bonding a protective sheet 3, such as a PET film, to the sensing board 1. A plurality of parallel x-electrodes 5 extending along the x-axis are formed on the front surface of the dielectric film 4 of the sensing board 1, and a plurality of parallel y-electrodes 6 extending along the y-axis are formed on the back surface of the dielectric film 4. The resist layer 7 is a layer of an epoxy resin, a polyester resin or a UV-setting resin formed in a thickness equal to that of the x-electrodes 5 in regions of the front surface of the dielectric film 4 in which the x-electrodes 5 are not formed. An adhesive layer 2 is formed on the back surface of the protective sheet 3. The protective sheet 3 is attached to the sensing board 1 by adhesive layer 2 adhesively bonded to the respective surfaces of the x-electrodes 5 and the resist layer 7. The surface of the protective sheet 3 serves as a touch surface to which touches are given with a position indicator, such as a finger. A circuitry, not shown, for driving and controlling the electrodes 5 and 6 of the sensing board 1 is formed on the back surface of the printed wiring board, not shown.

Since the recesses between the adjacent x-electrodes formed on the front surface of the dielectric film 4 are filled up with the resist layer 7 of a thickness equal to that of the x-electrodes 5, the front surface of the sensing board 1 provided with the resist layer 7 is a substantially flat surface scarcely having irregularities. Therefore, the protective sheet 3 can be bonded to the sensing board 1 without confining any bubbles on the front surface of the sensing board 1 by pressing the adhesive layer 2 formed on the back surface of the protective sheet 3 against the resist layer 7 and the surfaces of the x-electrodes. Accordingly, the variation of capacitance attributable to many bubbles of indefinite shapes can be avoided, the surface of the protective sheet 3 is not undulated, and the flat touch surface ensures satisfactory coordinate data input operation.

The principle of operation of the coordinate data input device is the same as that of the conventional coordinate data input device and hence the description thereof will be omitted.

Figure 2:
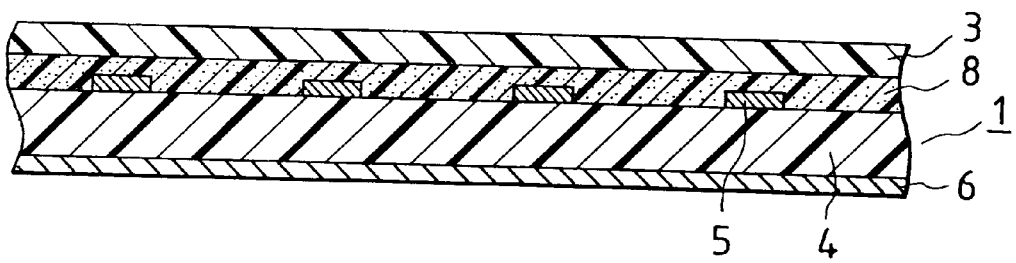
FIG. 2 is a fragmentary sectional view of a coordinate data input device in a second embodiment according to the present invention.
Figure 3:
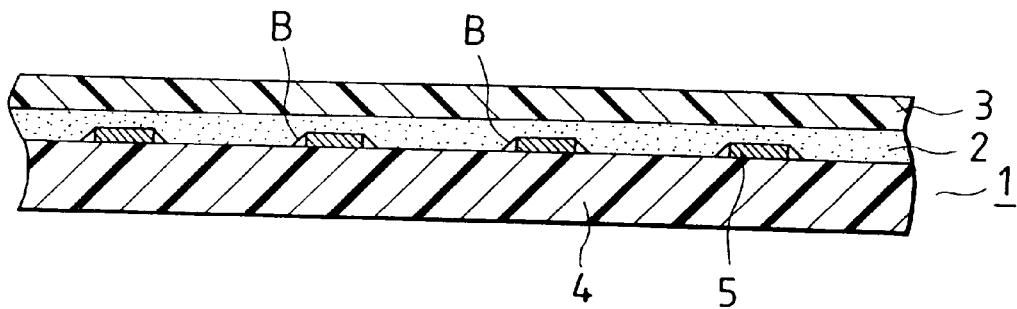
FIG. 3 is a fragmentary sectional view of a conventional coordinate data input device.

Referring to FIG. 2 showing a coordinate data input device in a second embodiment according to the present invention, in which parts like or corresponding to those shown in FIG. 1 are designated by the same reference characters, a layer of an adhesive gel, such as a low-temperature hot-melt adhesive, is formed on the back surface of a protective sheet 3 before placing the protective sheet 3 on a sensing board 1, and the layer of the adhesive gel sandwiched between the sensing board 1 and the protective sheet 3 is solidified to form an adhesive layer 8 after putting the sensing board 1 and the protective sheet 3 together. Since the layer of the adhesive gel deforms so as to conform to the irregular front surface of the sensing board 1 when a pressure is applied to the protective sheet 3 put on the sensing board 1, the flatness of the front surface of the protective sheet 3 is not deteriorated and the surface of the sensing board 1 need not be flattened before attaching the protective sheet 3 thereto. When the layer of the adhesive gel is solidified, spaces between the flat back surface of the protective sheet 3 and the irregular front surface of the sensing board 1 are filled up with the adhesive gel, and the adhesive gel forms the adhesive layer 8 having a desired adhesive strength when solidified. Accordingly, any bubbles are not confined on the sensing board 1, the variation of capacitance can be avoided, the surface of the protective sheet 3 is not undulated, and the protective sheet 3 provides a flat touch surface.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A coordinate data input device comprising:
   a sensing board fabricated by forming a plurality of parallel first electrodes on the front surface of a film and forming a plurality of parallel second electrodes perpendicularly to the first electrodes on the back surface of the film, and capable of providing a current corresponding to an electrostatic capacitance between the respective groups of the first and the second electrodes;
   a filling layer comprising a resist material and being of a thickness equal to that of the first electrodes, the filling layer being printed in recesses defined by adjacent first electrodes and the front surface of the film extending between the first electrodes, the filling layer completely filling the recesses such that the filled recesses are substantially free of voids and such that front surfaces of the first electrodes and the filling layer are substantially flush with each other;

a protective sheet to be touched with a position indicator; and an adhesive layer adhering the protective sheet to the front surfaces of the first electrodes and the filling layer, whereby the protective sheet is bonded to these surfaces substantially without gaps.

2. A coordinate data input device comprising:

a sensing board fabricated by forming a plurality of parallel first electrodes on the front surface of a film and forming a plurality of parallel second electrodes perpendicularly to the first electrodes on the back surface of the film, and capable of providing a current corresponding to an electrostatic capacitance between the respective groups of the first and the second electrodes;

a protective sheet to be touched with a position indicator adhesively bonded to the front surface of the sensing board; and an adhesive layer in which an adhesive gel of low viscosity fills recesses defined by adjacent first electrodes and the front surface of the film extending between the first electrodes in such way as to leave the recesses substantially free of voids, wherein the adhesive gel is spread over the back surface of the protective sheet before bonding the protective sheet to the sensing board.

3. A coordinate data input device according to claim 2, wherein the layer of the adhesive gel is formed by spreading the adhesive gel over the back surface of the protective sheet before bonding the protective sheet to the sensing board.

* * * * *